United States Patent [19]

Shiono

[11] Patent Number: 5,559,880
[45] Date of Patent: Sep. 24, 1996

[54] CIRCUIT FOR HANDS FREE TALKING

[75] Inventor: Takashi Shiono, Hyogo, Japan

[73] Assignee: Mitsubishi Denki Kabushiki Kaisha, Tokyo, Japan

[21] Appl. No.: 551,444

[22] Filed: Nov. 1, 1995

Related U.S. Application Data

[63] Continuation of Ser. No. 151,006, Nov. 12, 1993, abandoned.

[30] Foreign Application Priority Data

Jan. 19, 1993 [JP] Japan ................... 5-023190

[51] Int. Cl.$^6$ ............................. H04M 1/60; H04M 9/08
[52] U.S. Cl. ...................... 379/390; 379/388; 379/389
[58] Field of Search ........................ 379/387, 388, 379/389, 390, 391, 392, 419, 420

[56] References Cited

U.S. PATENT DOCUMENTS

| | | | |
|---|---|---|---|
| 4,555,596 | 11/1985 | Blomley | 379/389 |
| 4,648,110 | 3/1987 | Elsasser | 379/390 |
| 4,726,062 | 2/1988 | Martz et al. | 379/390 |
| 4,879,745 | 11/1989 | Arbel | 379/389 |
| 4,891,837 | 1/1990 | Walker et al. | 379/390 |
| 4,982,425 | 1/1991 | Yoshida | 379/390 |
| 4,989,242 | 1/1991 | Arnaud | 379/390 |
| 5,235,637 | 8/1993 | Kraz et al. | 379/387 |
| 5,398,786 | 3/1995 | Kurokawa et al. | 379/390 |
| 5,459,786 | 10/1995 | Tomiyori et al. | 379/390 |
| 5,471,528 | 11/1995 | Reesor | 379/390 |

FOREIGN PATENT DOCUMENTS

| | | | |
|---|---|---|---|
| 6062733 | 4/1985 | Japan . | |
| 61-067357 | 4/1986 | Japan | 379/388 |
| 61-161856 | 7/1986 | Japan | 379/388 |
| 61-195054 | 8/1986 | Japan | 379/389 |
| 62-012249 | 1/1987 | Japan | 379/388 |
| 6420767 | 1/1989 | Japan . | |
| 2194868 | 3/1988 | United Kingdom . | |
| 2197166 | 5/1988 | United Kingdom . | |

Primary Examiner—Jeffery Hofsass
Assistant Examiner—Scott L. Weaver
Attorney, Agent, or Firm—Rothwell, Figg, Ernst, & Kurz

[57] ABSTRACT

A circuit for hands free talking is mounted between a telephone main body for use in a vehicle, and a speaker and a microphone to realize hands free talking of a user of the telephone. In the circuit, an electronic volume controller is for use in audio signal processing, and the electronic volume controller includes a transmitting variable attenuator, a receiving variable attenuator, and an attenuator controller. A receiving level detector is provided to detect a signal level of a receive signal from the telephone main body, and decreases attenuation of the receiving variable attenuator and increases attenuation of the transmitting variable attenuator when a high signal level is detected.

16 Claims, 9 Drawing Sheets

5,559,880

CIRCUIT FOR HANDS FREE TALKING

This is a continuation of application Ser. No. 08/151,006, filed Nov. 12, 1993 now abandoned.

BACKGROUND OF THE INVENTION

1. Field of the Invention

The present invention relates to a circuit for hands free talking connected between a general telephone or a mobile phone or the like which enables simultaneous transmission and reception, i.e., simultaneous talking, and a microphone and a speaker so as to realize half-duplex hands free talking.

2. Description of the Prior Art

FIG. 1 is a block diagram showing a conventional circuit for hands free talking. In FIG. 1, reference numeral 1 means a transmit signal input terminal into which a transmit signal from a microphone is inputted, and 2 means a transmit signal output terminal from which the transmit signal is outputted to a telephone. Reference numeral 3 means a receive signal input terminal into which a receive signal from the telephone is inputted, and 4 means a receive signal output terminal from which the receive signal is outputted to a speaker. Reference numeral 5 means an integrated circuit (hereinafter referred to as IC) for use in a speaker phone to realize half-duplex talking by controlling attenuation of the transmit signal and the receive signal. For example, IC M34118 (available from Motorola, Inc.) may be used as the IC 5. Further, reference numeral 6 means a speaker amplifier to amplify the receive signal which is outputted to the speaker.

In addition, in the IC 5, reference numeral 10 means a transmitting variable attenuator (S. V. ATT) to enable variation in the attenuation of the transmit signal, 11 means a receiving variable attenuator (R. V. ATT) to enable variation in the attenuation of the receive signal, and 12 is an attenuator controller to control attenuation of the transmitting variable attenuator 10 and the receiving variable attenuator 11. Reference numeral 13 means a level detector to detect a signal level of an input terminal of the transmitting variable attenuator 10, 14 means a level detector to detect a signal level of an output terminal of the transmitting variable attenuator 10, 15 is a level detector to detect a signal level of an input terminal of the receiving variable attenuator 11, and 16 is a level detector to detect a signal level of an output terminal of the receiving variable attenuator 11. Reference numeral 17 means a microphone amplifier to amplify the transmit signal input into the transmit signal input terminal 1, 18 means a background noise monitor (S. N. Mon) to distinguish noise from voice on the transmitting side, and 19 is a background noise monitor (R. N. Mon) to distinguish noise from voice on the receiving side.

The positioning of such a hands free circuit with respect to a telephone and a microphone and loudspeaker is shown in FIG. 1A wherein a hands free circuit 100 is positioned between a telephone 102 and a loudspeaker 106. The operation of the hands free circuit 100 to enable hands free transmission of audio signals from the microphone 104 and hands free reception of signals at the loudspeaker 106 through the telephone 102 is well known in the art. The present invention relates to an improvement in the circuit for hands free talking 100 which is connectible between a telephone 102 and speaker 106 and microphone 104.

A description will now be given of the operation. An aural signal input through the microphone which is connected to the transmit signal input terminal 1, is amplified by the amplifier 17 in the IC 5, and is thereafter input into the transmitting variable attenuator 10. Concurrently, the output of the amplifier 17 is also input into the level detector 13 through a capacitor and a resistor. The transmit signal passing through the transmitting variable attenuator 10 is outputted from the transmit signal output terminal 2 to the telephone. At the same time, the output of the transmitting variable attenuator 10 is also input into the level detector 14 through a capacitor and a resistor.

On the other hand, the receive signal from the telephone is inputted into the IC 5 through the receive signal input terminal 3, and is inputted into the receiving variable attenuator 11 of the IC 5. Concurrently, the receive signal is also input into the level detector 15 through a capacitor and a resistor. The receive signal passing through the receiving variable attenuator 11 is inputted into the amplifier 6 to be amplified, and is outputted to the speaker through the receive signal output terminal 4. At the same time, the output of the receiving variable attenuator 11 is also input into the level detector 16 through a capacitor and a resistor.

The four level detectors 13 to 16 are connected to the attenuator controller 12. The attenuator controller 12 compares levels at four positions to control the attenuation of the transmitting variable attenuator 10 and the receiving variable attenuator 11 based on results of the comparison. This control equivalently opens either a transmitting switch or a receiving switch to set the circuit in a transmitting mode or a receiving mode. In the operation, it is possible to distinguish the voice from ambient noise by the background noise monitors 18 and 19 mounted on the transmitting side and the receiving side. Such a half-duplex talking system can avoid howling generated due to telephone line echo or acoustic coupling from the speaker to the microphone.

Arts relevant to the conventional circuit for hands free talking are disclosed in, for example, Japanese Patent Application Laid-Open Nos. 60-62733, 61-262325, and 64-20767.

Since the conventional circuit for hands free talking is provided as set forth above, there are several problems as follows: Delay of detection may cause delay of switch changing, resulting in a truncation of the beginning portion of a word. At a time of simultaneous talking, the operation of the transmitting variable attenuator 10 and the receiving variable attenuator 11 become unstable so that a speech level becomes unstable. Further, gain of the respective level detectors 13 to 16 is determined on the basis of a value of each resistor connected to each pin of the IC 5, and it is difficult to set the transmission and the reception in balance. Erroneous balance may cause tendency to be easily switched to one of a transmission mode and a reception mode, and the other mode may be sacrificed. Additionally, the IC is an expensive IC as is for the speaker phone.

SUMMARY OF THE INVENTION

In view of the foregoing, the present invention is made to overcome the problems as set forth above. It is an object of the present invention to provide an inexpensive circuit for hands free talking which enables rapid switching control, and natural talking like employing a full-duplex talking system while employing a half-duplex talking system using a speech switch.

According to the first aspect of the present invention, for achieving the above-mentioned object, there is provided a circuit for hands free talking having an electronic volume control including a transmitting variable attenuator and a receiving variable attenuator and an attenuator controller to control attenuation of the attenuators, and a receiving level detector to generate a control Signal for attenuation control of the attenuators based on a signal level of a receive signal so as to feed the control signal to the attenuator controller in the electronic volume control.

The receiving level detector feeds the control signal generated on the basis of the signal level of the receive signal to the attenuator controller to control the attenuation of the transmitting variable attenuator and the receiving variable attenuator in the electronic volume control so as to control the attenuation of the transmitting variable attenuator and the receiving variable attenuator. It is thereby possible to provide an inexpensive circuit for hands free talking which enables natural talking.

According to the configuration as set forth above, there is an effect in that it is possible to provide an inexpensive circuit for hands free talking which enables the rapid switching control, the natural talking like employing the full-duplex talking system while employing the half-duplex talking system using the speech switch, and employment of the electronic volume control for use in audio.

According to the second aspect of the present invention, there is provided a circuit for hands free talking in which a transmit signal input into a transmitting variable attenuator is inputted through a filter to compress a frequency band of the transmit signal.

The filter avoids occurrence of howling, and reduces ambient noise on the near side by restricting the frequency band of the transmit signal input into the transmitting variable attenuator to substantially the minimum frequency band.

According to the third aspect of the present invention, there is provided a circuit for hands free talking which causes a detected value of a signal level detected by a transmitting level detector based on a transmit signal to interfere with a receive signal input into a receiving level detector.

The transmitting level detector causes the detected value of the signal level detected on the basis of the transmit signal to interfere with the receive signal input into the receiving level detector. Thereby, in case the signal level of the transmit signal is high, a mode is switched over to a transmitting mode irrespective of an unnecessary receive signal.

According to the fourth aspect of the present invention, there is provided a circuit for hands free talking in which an attenuation limiting device is connected in parallel with a transmitting variable attenuator and a receiving variable attenuator in an electronic volume to limit attenuation to a predetermined value or less.

The attenuation limiting device is connected in parallel with the transmitting variable attenuator and the receiving variable attenuator in the electronic volume control to limit attenuation of the attenuators to the predetermined value or less. It is thereby possible to relax interruption or generation of unnaturalness in speech.

The above and further objects and novel features of the invention will more fully appear from the following detailed description when the same is read in connection with the accompanying drawing. It is to be expressly understood, however, that the drawings are for purpose of illustration only and are not intended as a definition of the limits of the invention.

DETAILED DESCRIPTION OF THE PREFERRED EMBODIMENTS

Preferred embodiments of the invention will now be described in detail referring to the accompanying drawings.

EMBODIMENT 1

Figure 1:
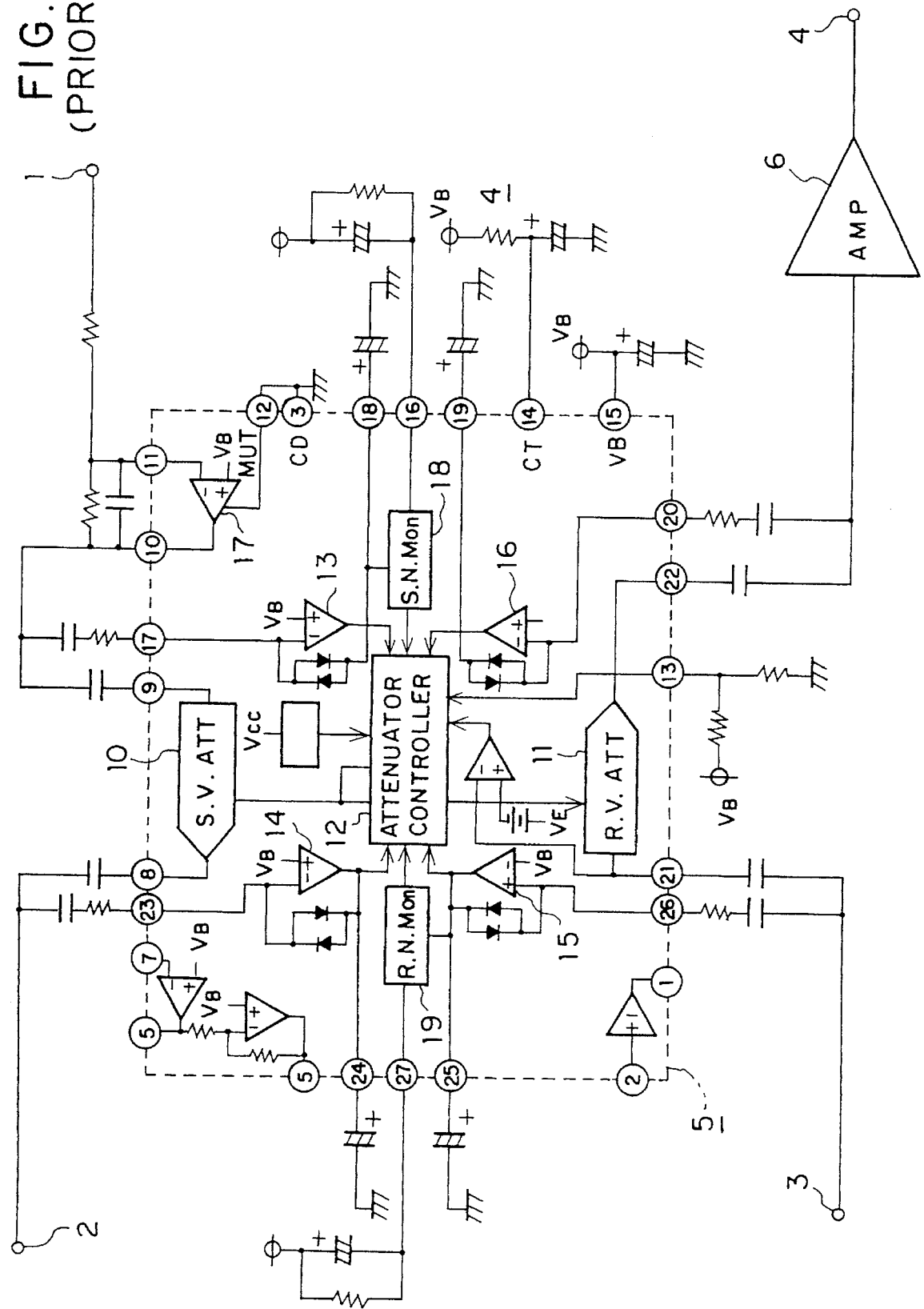
FIG. 1 is a block diagram showing a conventional circuit for hands free talking.
Figure 1A:
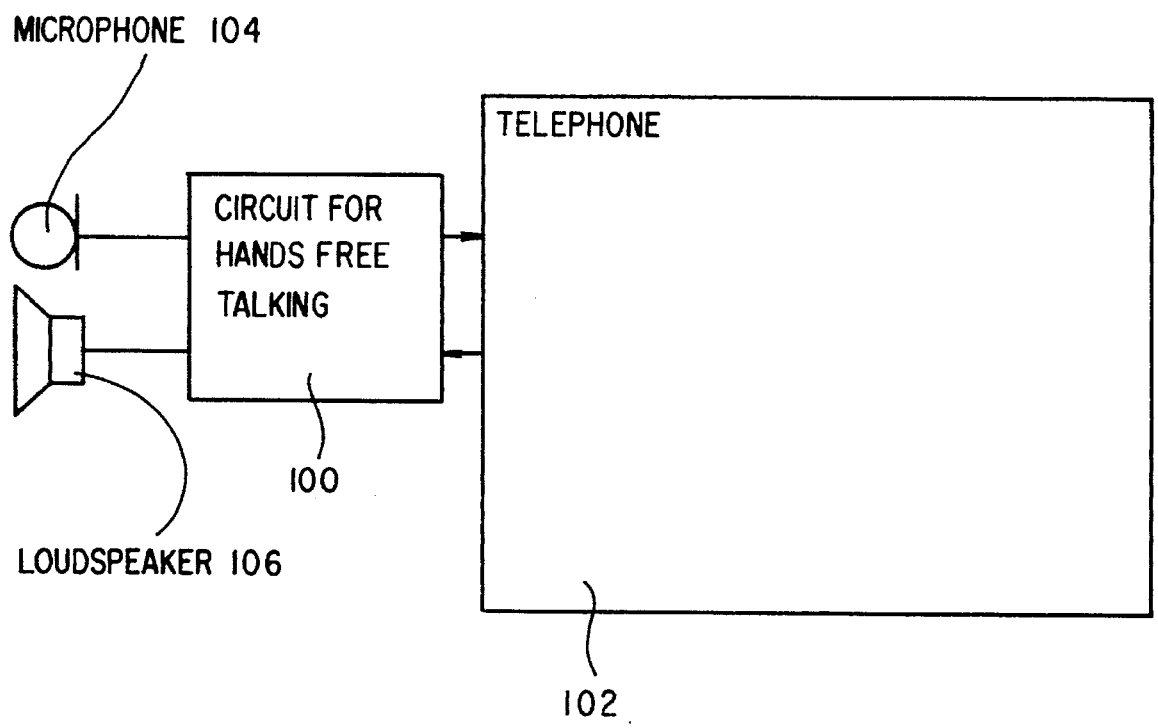
FIG. 1A is a block diagram showing the position of a conventional hands free circuit with respect to a telephone, microphone and a speaker.
Figure 2:
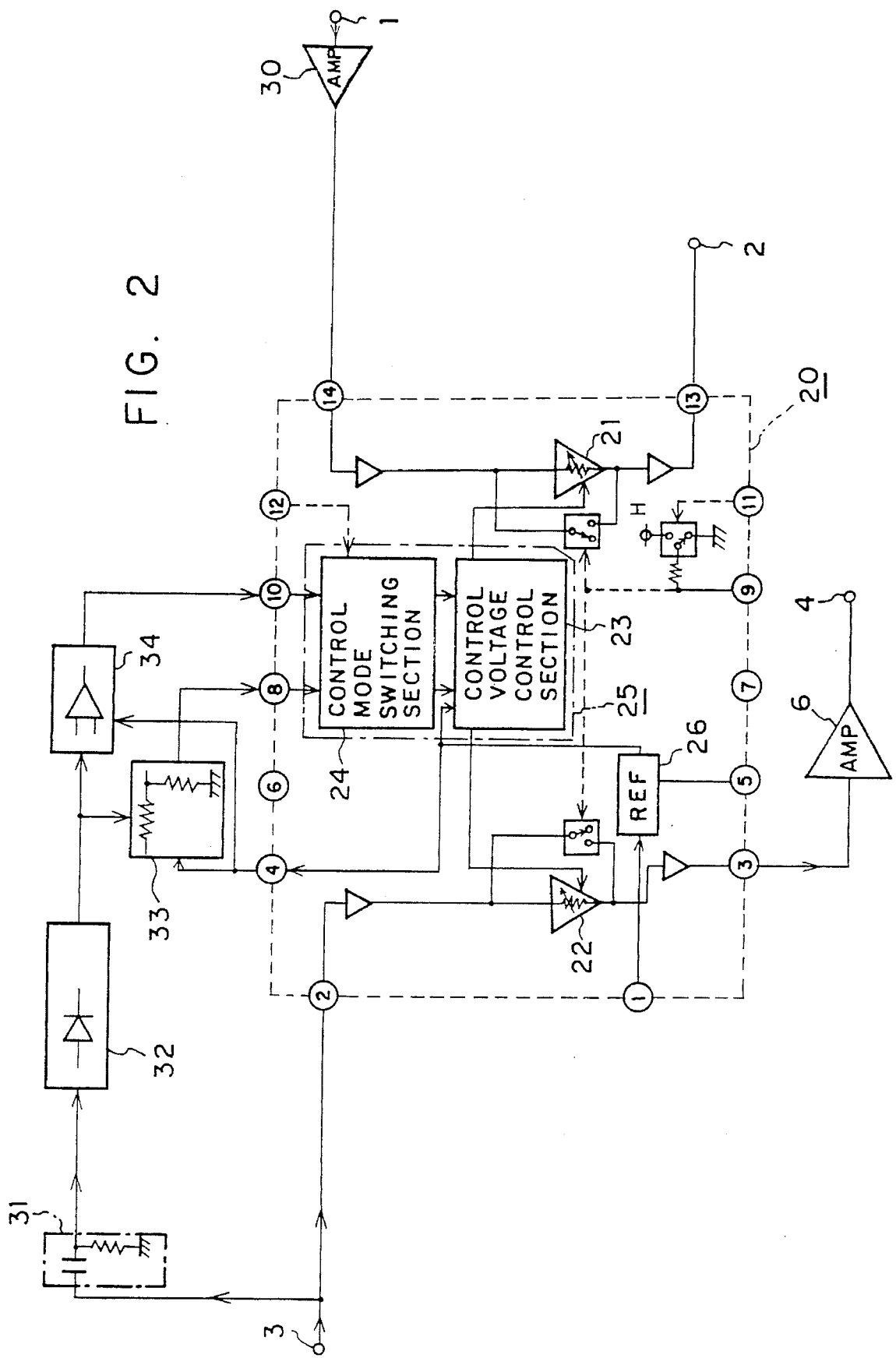
FIG. 2 is a block diagram showing a circuit for hands free talking according to the embodiment 1 of the present invention.

FIG. 2 is a block diagram showing the embodiment 1 of the present invention. In FIG. 2, reference numeral 1 means a transmit signal input terminal, 2 means a transmit signal output terminal, 3 is a receive signal input terminal, 4 is a receive signal output terminal, and 6 is a speaker amplifier. These component parts are identical with or equivalent to the prior art component parts designated by the same reference numerals in FIG. 1, and detailed descriptions thereof are omitted.

Reference numeral 20 means an electronic volume control for use in audio signal processing using an IC, which is provided instead of a conventional IC 5 for a speaker phone, and for example, a volume M51132L (available from Mitsubishi Denki Kabushiki Kaisha) may be employed as the electronic volume control 20. In the electronic volume control 20, reference numeral 21 means a transmitting variable attenuator to enable variation in attenuation of a transmit signal, and 22 means a receiving variable attenuator to enable attenuation of a receive signal. The transmitting variable attenuator 21 and the receiving variable attenuator 22 respectively include, for example, a voltage control amplifier. Reference numeral 23 means a control voltage control section to feed control voltage to the transmitting variable attenuator 21 and the receiving variable attenuator 22 so as to control attenuation of the attenuators, 24 means a control mode switching section to perform control mode switching according to a control signal which is externally fed, and 25 is an attenuator controller including the control voltage control section 23 and the control mode switching section 24. Further, reference numeral 26 means a reference power source section (REF) to generate reference voltage which is fed to the control voltage control section 23 of the attenuator controller 25.

In addition, reference numeral 30 means a microphone amplifier to amplify a transmit signal which is inputted into the transmit signal input terminal 1, and unlike a conventional microphone amplifier 17, the microphone amplifier 30 is provided external to the electronic volume control 20. Reference numeral 31 means a high pass filter to eliminate an ambient noise component of the receive signal input into the receive signal input terminal 3, and for example, a primary filter having cutoff frequency of 700 Hz is employed as the high pass filter 31. Reference numeral 32 means an ac/dc converter serving as a receiving level detector to detect a signal level of the receive signal whose ambient noise component is removed, and for example, a full-wave rectifier circuit including a combination of an operational amplifier and a diode is employed as the ac/dc converter 32. Reference numeral 33 means a voltage converter to receive output from the ac/dc converter 32 so as to perform voltage conversion according to the reference voltage from the reference power source section 26 in the electronic volume control 20, and generate a control signal so as to feed it to the control mode switching section 24. Reference numeral 34 means a phase inverter to receive the output from the ac/dc converter 32, and generate a control signal having an inverted phase according to the reference voltage from the reference power source section 26 so as to feed it to the control mode switching section 24.

A description will now be given of the operation. An aural signal which is inputted from the microphone connected to the transmit signal input terminal 1 is amplified by the amplifier 30, and is inputted into the transmitting variable attenuator 21 of the electronic volume control 20. The transmit signal passes through the transmitting variable attenuator 21, and is outputted through the transmit signal output terminal 2 to a telephone. Further, a receive signal from the telephone is inputted into two branches through the transmit signal input terminal 3. One branch output is inputted into the receiving variable attenuator 22 in the electronic volume control 20. The receive signal passing through the receiving variable attenuator 22 is amplified by the amplifier 6, and is thereafter output through the receive signal output terminal 4 to a speaker.

The other branch output is inputted into the high pass filter 31, and the ambient noise component from the far end side (i.e., the side of a mating user of the telephone connected to the circuit) is eliminated. The high pass filter 31 is the primary filter having the cutoff frequency of 700 Hz as described above, and it is possible to attenuate the ambient noise typically having a Hoth spectrum characteristic. The ambient noise component of the receive signal is attenuated by the high pass filter 31, and the receive signal is converted by the ac/dc converter 32 into dc, and is inputted into the voltage converter 33 and the phase inverter 34. In the voltage converter 33, the input signal is added to the reference voltage from the reference power source section 26 of the electronic volume control 20 so as to generate a control signal to appropriately control the electronic volume control 20, and the resultant control signal is inputted into a control terminal of the control mode switching section 24 on the side of the receiving variable attenuator 22. Similarly, the phase inverter 34 also generates a control signal having an inverted phase according to the reference voltage from the reference power source section 26, and the resultant control signal is inputted into the control terminal of the control mode switching section 24 on the side of the transmitting variable attenuator 21.

In a stationary condition, the transmitting variable attenuator 21 has low impedance, and the receiving variable attenuator 22 has high impedance and a switch is equivalently opened to the transmitting side. That is, there is established a condition where a user of the telephone connected to the circuit can speak. When the far end user speaks, the voltage converter 33 and the phase inverter 34 generate each control signal to equivalently open the switch on the receiving side according to a detected level of the receiving level detector, i.e., the ac/dc converter 32. These control signals cause high impedance of the transmitting variable attenuator 21 and low impedance of the receiving variable attenuator 22 so that the switch is opened on the receiving side. The ac/dc converter 32 has a time constant. A rapid variation in attenuation of the transmission and the reception is prevented by the time constant. Hence, if the far end user and a near user (i.e., a user of the telephone connected to the circuit) speak simultaneously, a receiving sound volume level never becomes unstable.

As set forth above, the receiving level detector generates the control signal based on the signal level of the receive signal, and the control signal is fed to the attenuator controller in the electronic volume so that the attenuator controller controls the attenuation of the transmitting variable attenuator and the receiving variable attenuator. Consequently, it is possible to provide a rapid switching control and natural talking like full-duplex talking while employing a half-duplex talking system using a speech switch. Further, it is possible to employ the electronic volume control for use in audio signal processing, and provide an inexpensive circuit for hands free talking. In the embodiment, though the configuration including the high pass filter 31 has been described, another configuration without the high pass filter 31 may be employed while an effect to avoid the ambient noise on the far end side is reduced.

EMBODIMENT 2

Figure 3:
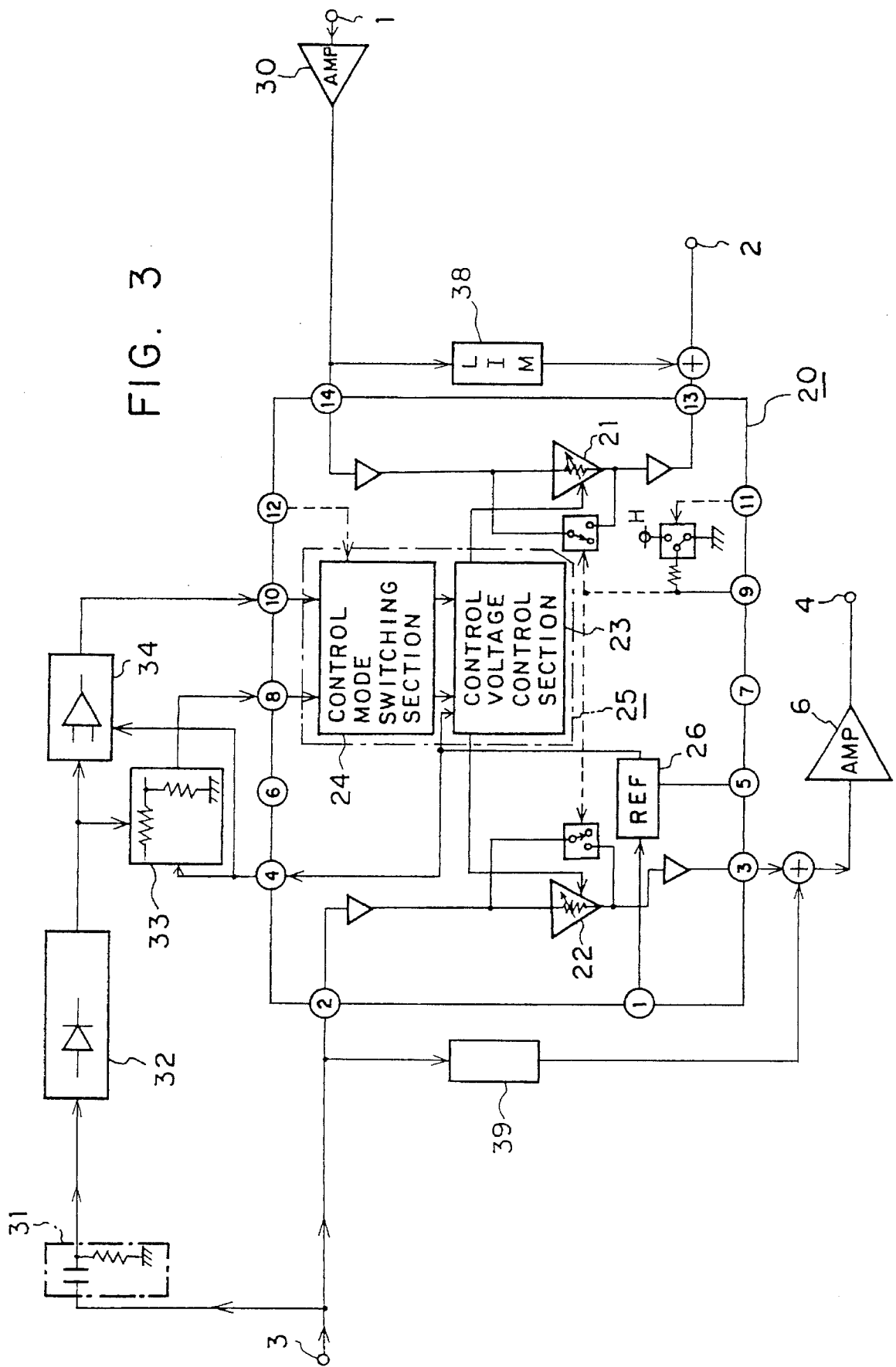
FIG. 3 is a block diagram showing a circuit for hands free talking according to the embodiment 2 of the present invention.

Referring now to FIG. 3, a description will be given of the embodiment 2 of the present invention. In FIG. 3, reference numeral 38 means an attenuation limiting device (LIM) connected in parallel with a transmitting variable attenuator 21 of the electronic volume control 20, and 39 means an attenuation limiting device (LIM) similarly connected in parallel with a receiving variable attenuator 22. Other component parts are identical with corresponding component parts in FIG. 2.

In case the attenuation limiting devices 38 and 39 are connected as described above, attenuation of the transmitting variable attenuator 21 is limited by the attenuation limiting device 38 to a predetermined value or less, and attenuation of the receiving variable attenuator 22 is limited by the attenuation limiting device 39 to a predetermined value or less. It is thereby possible to keep out interruption or generation of unnaturalness of speech due to excessive attenuation of the transmitting variable attenuator 21 or the receiving variable attenuator 22.

As set forth above, the attenuation limiting devices are connected in parallel with the transmitting variable attenuator and the receiving variable attenuator. Therefore, it is possible to limit the respective attenuation to the predetermined values or less, and lighten the interruption or the generation of unnaturalness in the speech.

EMBODIMENT 3

Figure 4:
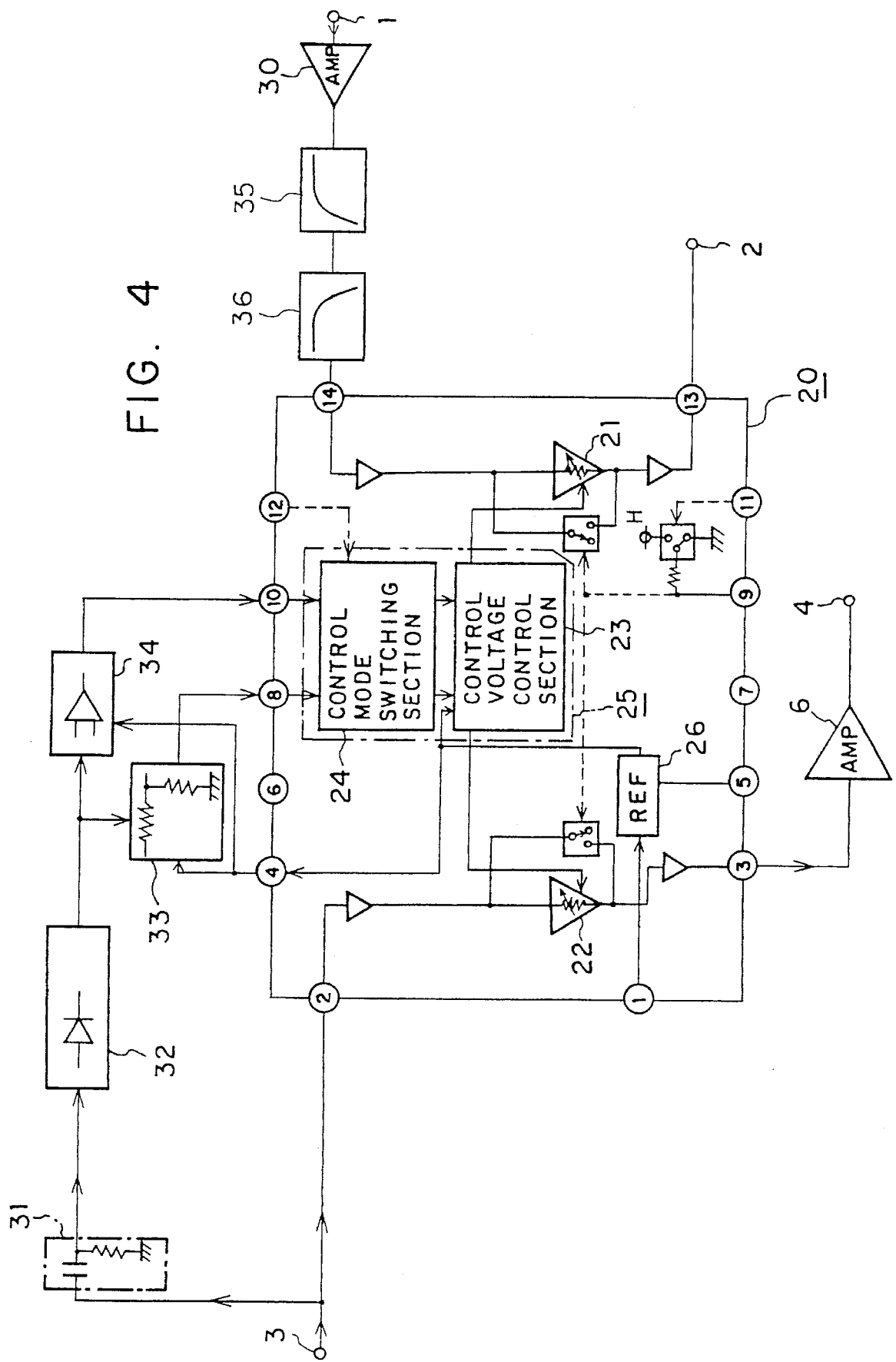
FIG. 4 is a block diagram showing a circuit for hands free talking according to the embodiment 3 of the present invention.

Referring now to FIG. 4, a description will be given of the embodiment 3 of the present invention. In FIG. 4, reference numeral 35 means a high pass filter, and 36 means a low pass filter. The high pass filter 35 and the low pass filter 36 limit a frequency band of a transmit signal which is inputted from an amplifier 30 into a transmitting variable attenuator 21 of an electronic volume control 20 to substantially the minimum required frequency band necessary for voice transmission. For example, a Chebyshev tertiary filter having cutoff frequency of 700 Hz is employed as the high pass filter 35, and a primary filter having cutoff frequency of 1.5 kHz is employed as the low pass filter 36.

A description will now be given of the operation. In case the circuit for hands free talking is particularly applied to a mobile phone or the like, ambient noise easily catches the far end user's ear since the switch on the transmitting side is opened in a stationary condition as set forth above. Further, when the noise sneaks on the receiving side by a line echo, control of transmitting and receiving attenuators may be adversely affected by, for example, a fact in that a mode is switched over to the receiving side because the noise serves as an unnecessary receive signal even if the far end user is silent. In order to overcome the drawbacks, the ambient noise is attenuated by the high pass filter 35. In this case, the ambient noise typically has a Hoth spectrum characteristic so that the ambient noise can be sufficiently removed by the high pass filter 35. The transmit signal whose ambient noise is removed causes a tinkling voice to some extent. In order to overcome the unnaturalness, and reduce howling, the transmit signal passing through the high pass filter 35 passes through the low pass filter 36. In such a way, it is possible to reduce the ambient noise on the near side by limiting the frequency band of the transmit signal to the essential frequency band. Further, in case, for example, a speaker having its peaks in the vicinity of 600 Hz and 3 kHz in view of a frequency characteristic is employed in order to improve receiving articulation, no howling occurs. Accordingly, it is possible to use such a speaker on the receiving side without any problems.

As set forth above, the frequency band of the transmit signal input into the transmitting variable attenuator is limited by the filter to substantially the minimum required frequency band necessary for voice transmission. As a result, it is possible to avoid generation of the howling, and reduce the ambient noise on the near side. In the embodiment, though the configuration including the high pass filter 31 has been described, another configuration without the high pass filter 31 may be employed while an effect to avoid the ambient noise on the side of the far end is reduced.

EMBODIMENT 4

Figure 5:
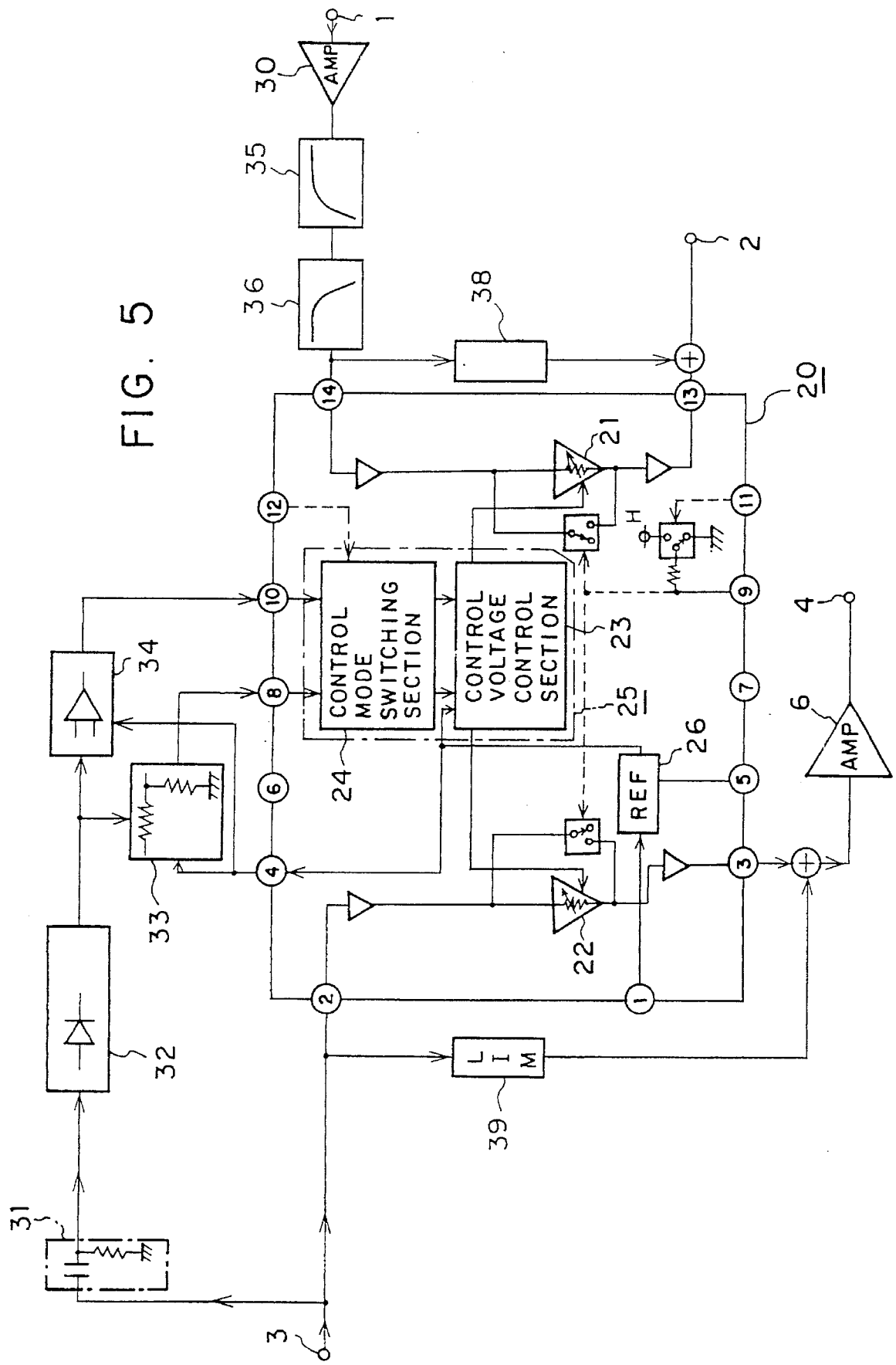
FIG. 5 is a block diagram showing a circuit for hands free talking according to the embodiment 4 of the present invention.

Referring now to FIG. 5, a description will be given of the embodiment 4 of the present invention. In FIG. 5, reference numeral 38 means an attenuator limiting device (LIM) connected in parallel with a transmitting variable attenuator 21 of an electronic volume control 20, and 39 means an attenuator limiting device (LIM) similarly connected in parallel with a receiving variable attenuator 22. Other component parts are identical with corresponding component parts in FIG. 4.

In case the attenuation limiting devices 38 and 39 are connected as described above, attenuation of the transmitting variable attenuator 21 is limited by the attenuation limiting device 38 to a predetermined value or less, and attenuation of the receiving variable attenuator 22 is limited by the attenuation limiting device 39 to a predetermined value or less. It is thereby possible to keep out interruption or generation of unnaturalness of speech due to excessive attenuation of the transmitting variable attenuator 21 or the receiving variable attenuator 22.

EMBODIMENT 5

Figure 6:
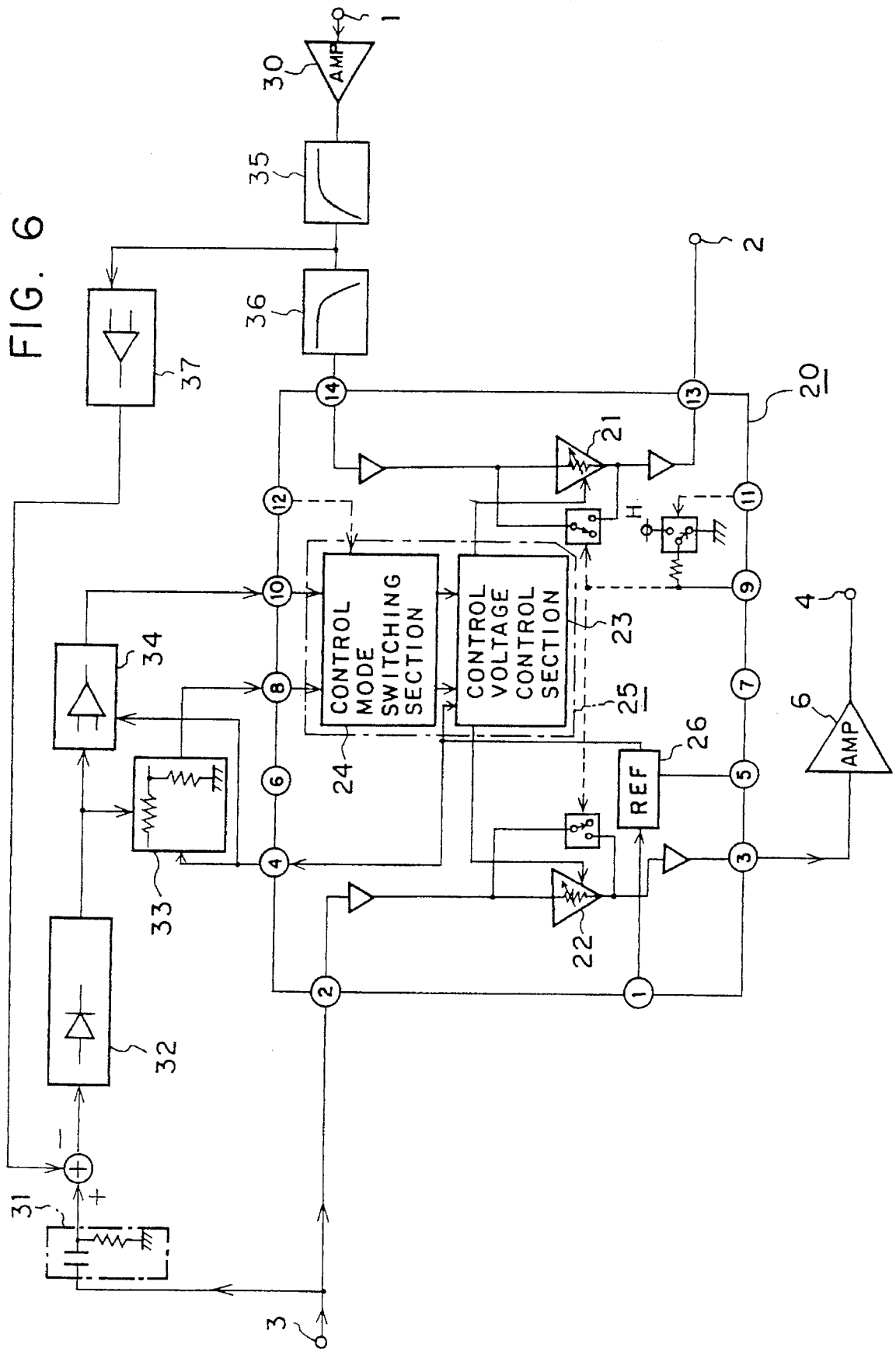
FIG. 6 is a block diagram showing a circuit for hands free talking according to the embodiment 5 of the present invention.

Referring now to FIG. 6, a description will be given of the embodiment 5 of the present invention. In FIG. 6, reference numeral 37 means an ac/dc converter serving as a transmitting level detector to detect a signal level of a receive signal whose ambient noise component is removed by a high pass filter 35 so as to cause the detected value to interfere with the receive signal input into an ac/dc converter 32 serving as a receiving level detector. For example, a half-wave rectifier circuit including an operational amplifier is used as the ac/dc converter 37.

A description will now be given of the operation. The transmit signal passing through the high pass filter 35 is inputted into a low pass filter 36 as in the embodiment 3. However, in this embodiment, the transmit signal is also input into the ac/dc converter 37. The ac/dc converter 37 converts the input transmit signal into dc, and sends it to an input terminal of the ac/dc converter 32. It is possible to reduce an input level to the ac/dc converter 32 because of interference of the dc from the ac/dc converter 37 even if an ac signal (a receive signal) is inputted from the high pass filter 31 into the ac/dc converter 32. Therefore, even if the signal level of the receive signal is high irrespective of speech by a near end user only due to sneak of a signal output from a transmit signal output terminal 2 on the receiving side (i.e., on the receiving side of a telephone connected to the circuit) through a line echo or an unnecessary receive signal such as the ambient noise on the receiving side, a system mode can be switched over to the transmitting side.

In this case, since priority is given to attenuator control on the basis of a receiving level, a receiving sound volume level never becomes unstable even if the far end user and the near user talk simultaneously.

EMBODIMENT 6

Figure 7:
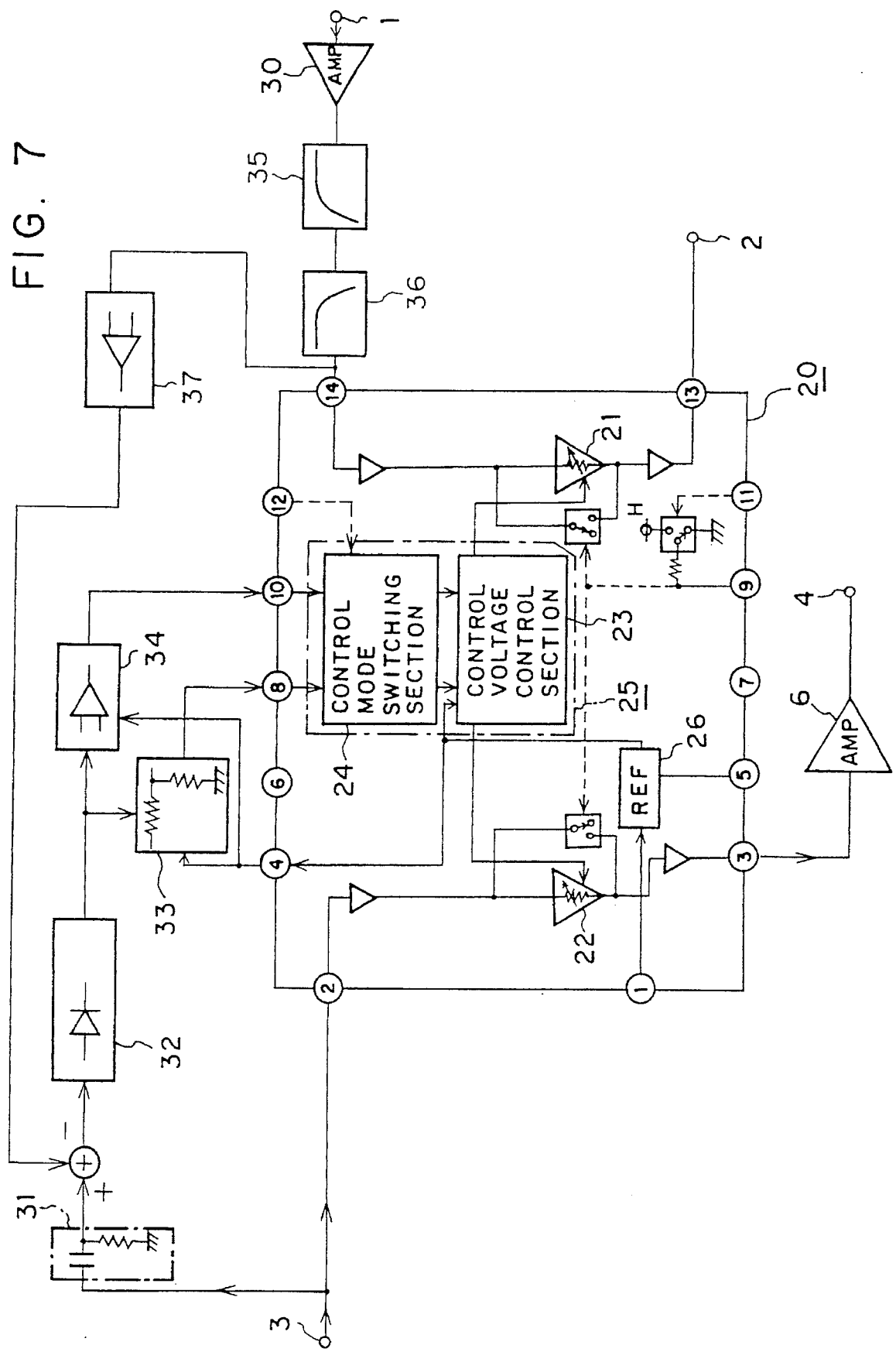
FIG. 7 is a block diagram showing a circuit for hands free talking according to the embodiment 6 of the present invention.

The embodiment 5 has been described with reference to a case where output of a high pass filter 35 is branched to be input into an ac/dc converter 37 serving as a transmitting level detector. However, as shown in FIG. 7, output of a low pass filter 36 may be branched and may be input into the ac/dc converter 37. In this case, it is possible to employ one band pass filter instead of the high pass filter 35 and the low pass filter 36.

As set forth above, the transmitting level detector causes the detected value of the signal level detected on the basis of the transmit signal to interfere with the receive signal input into the receiving level detector. Thereby, in case the signal level of the transmit signal is high, a mode can be switched over to a transmitting mode irrespective of unnecessary receive signal. In the embodiment, though the configuration including the high pass filter 31 has been described, another configuration without the high pass filter 31 may be employed while an effect to avoid the ambient noise on the far end side is reduced.

EMBODIMENT 7

Figure 8:
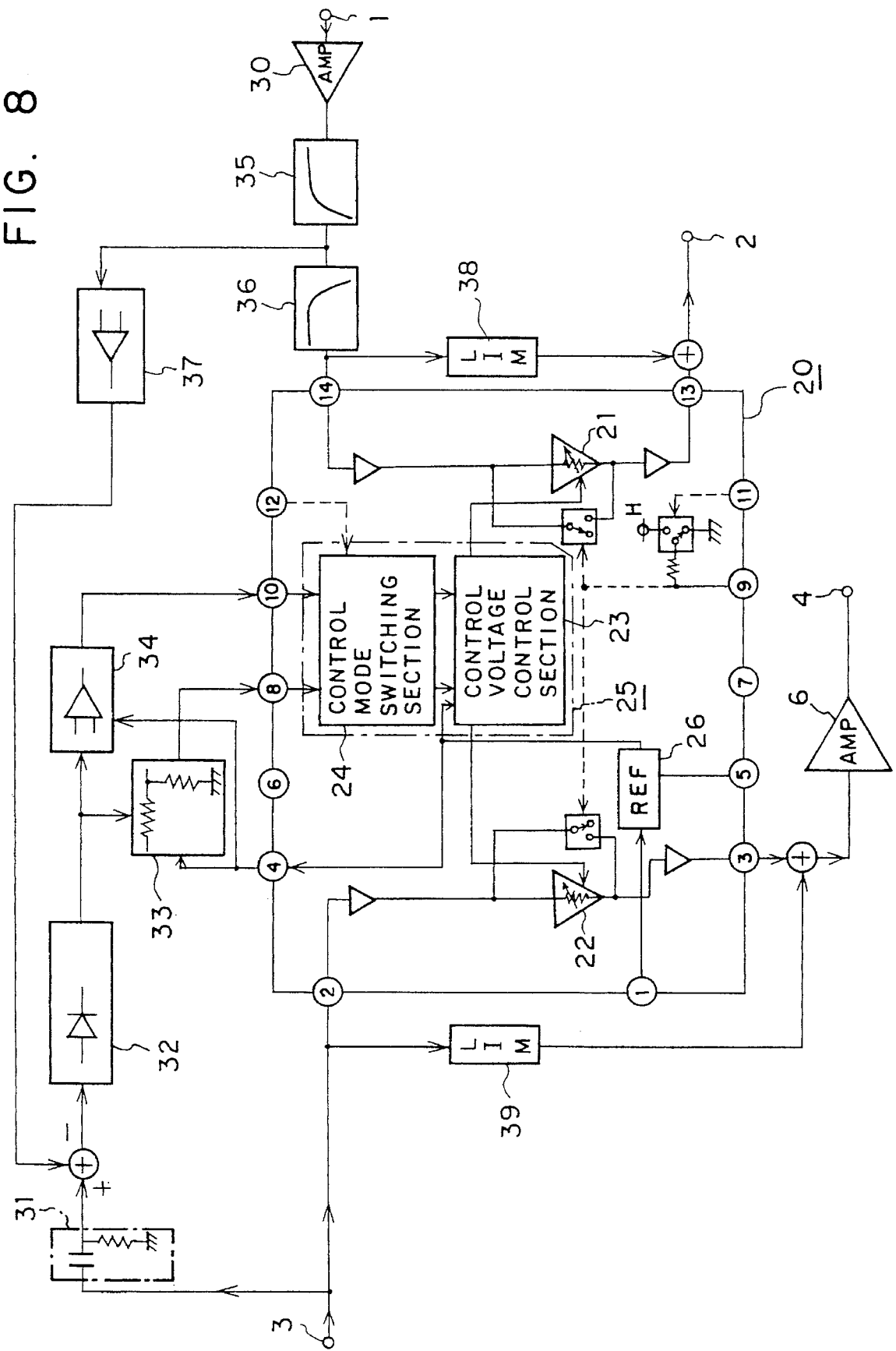
FIG. 8 is a block diagram showing a circuit for hands free talking according to the embodiment 7 of the present invention.

Referring now to FIG. 8, a description will be given of the embodiment 7 of the present invention. In FIG. 8, reference numeral 38 means an attenuator limiting device (LIM) connected in parallel with a transmitting variable attenuator 21 of an electronic volume control 20, and 39 means an attenuator limiting device (LIM) similarly connected parallel with a receiving variable attenuator 22. Other component parts are identical with corresponding component parts in FIG. 6.

In case the attenuation limiting devices 38 and 39 are connected as described above, attenuation of the transmitting variable attenuator 21 is limited by the attenuation limiting device 38 to a predetermined value or less, and attenuation of the receiving variable attenuator 22 is limited by the attenuation limiting device 39 to a predetermined value or less. It is thereby possible to keep out interruption or generation of unnaturalness of speech due to excessive attenuation of the transmitting variable attenuator 21 or the receiving variable attenuator 22.

As set forth above, the attenuation limiting device is connected in parallel with the transmitting variable attenuator and the receiving variable attenuator. As a result, it is possible to limit the respective attenuation to the predetermined values or less, and keep out the interruption or the generation of unnaturalness in the speech.

While preferred embodiments of the invention have been described using specific terms, such description is for illustrative purposes only, and it is to be understood that changes and variations may be made without departing from the spirit or scope of the following claims.

What is claimed is:

1. A circuit for hands free talking for being connected between a telephone and a speaker and a microphone which are separate from said telephone to realize hands free talking for a user of said telephone, said circuit comprising:

a receiving level detector for detecting the signal level of a receive signal which is sent from a far end side to said telephone and for generating a control signal responsive to said signal level; and an electronic volume control circuit for controlling the volume of transmit and receive audio signals, said electronic volume control circuit including a transmitting variable attenuator to attenuate the transmit signal which is sent from said microphone through said telephone to reach said far end side, a receiving variable attenuator to attenuate said receive signal, and an attenuator controller to control attenuation of said transmitting variable attenuator and said receiving variable attenuator, said attenuator controller being connected to said receiving level detector to respond only to said control signal which is fed from said receiving level detector and to set said transmitting variable attenuator at a high impedance only when said control signal which is fed from said receiving level detector indicates that a user at said far end is speaking.

2. A circuit for hands free talking according to claim 1, wherein said electronic volume control circuit comprises an integrated circuit for audio signal processing of the transmit and receive signals.

3. A circuit for hands free talking according to claim 1 further comprising:

an attenuation limiting device connected in parallel with said transmitting variable attenuator to limit the attenuation of said transmitting variable attenuator to a value which is no greater than a predetermined value; and an attenuation limiting device connected in parallel with said receiving variable attenuator to limit the attenuation of said receiving variable attenuator to a value which is no greater than a predetermined value.

4. A circuit for hands free talking according to claim 1 further comprising a filter having a bandpass characteristic so as to feed the transmit signal, with undesirable frequencies eliminated from essential voice information carrying frequencies, into said transmitting variable attenuator.

5. A circuit for hands free talking according to claim 4 further comprising:

an attenuation limiting device connected in parallel with said transmitting variable attenuator to limit the attenuation of said transmitting variable attenuator to a value which is no greater than a predetermined value; and an attenuation limiting device connected in parallel with said receiving variable attenuator to limit the attenuation of said receiving variable attenuator to a value which is no greater than a predetermined value.

6. A circuit for hands free talking according to claim 4, wherein said filter includes a high pass filter having cutoff frequency of 700 Hz, and a low pass filter having cutoff frequency of 1.5 kHz.

7. A circuit for hands free talking according to claim 4, further comprising a transmitting level detector to detect a signal level of said transmit signal for subtraction from said receive signal to reduce the signal level of said receive signal.

8. A circuit for hands free talking according to claim 7 further comprising:

an attenuation limiting device connected in parallel with said transmitting variable attenuator to limit the attenuation of said transmitting variable attenuator to a value which is no greater than a predetermined value; and an attenuation limiting device connected in parallel with said receiving variable attenuator to limit the attenuation of said receiving variable attenuator to a value which is no greater than a predetermined value.

9. A circuit for hands free talking according to claim 1 further comprising a high pass filter to remove low-frequency noise in said receive signal so as to feed the receive signal with the noise removed to said receiving level detector.

10. A circuit for hands free talking according to claim 9, wherein said electronic volume control circuit comprises an integrated circuit for audio signal processing of the transmit and receive signals.

11. A circuit for hands free talking according to claim 9 further comprising:

an attenuation limiting device connected in parallel with said transmitting variable attenuator to limit the attenuation of said transmitting variable attenuator to a value which is no greater than a predetermined value; and an attenuation limiting device connected in parallel with said receiving variable attenuator to limit the attenuation of said receiving variable attenuator to a value which is no greater than a predetermined value.

12. A circuit for hands free talking according to claim 9 further comprising a filter having a bandpass characteristic so as to feed the transmit signal, with undesirable frequencies eliminated from essential voice information carrying frequencies, into said transmitting variable attenuator.

13. A circuit for hands free talking according to claim 12 further comprising:

an attenuation limiting device connected in parallel with said transmitting variable attenuator to limit the attenuation of said transmitting variable attenuator to a value which is no greater than a predetermined value; and an attenuation limiting device connected in parallel with said receiving variable attenuator to limit the attenuation of said receiving variable attenuator to a value which is no greater than a predetermined value.

14. A circuit for hands free talking according to claim 12, wherein said filter includes a high pass filter having cutoff frequency of 700 Hz, and a low pass filter having cutoff frequency of 1.5 kHz.

15. A circuit for hands free talking according to claim 12 further comprising a transmitting level detector to detect a signal level of said transmit signal for subtraction from said receive signal to reduce the signal level of said receive signal.

16. A circuit for hands free talking according to claim 15 further comprising:

an attenuation limiting device connected in parallel with said transmitting variable attenuator to limit the attenuation of said transmitting variable attenuator to a value which is no greater than a predetermined value; and an attenuation limiting device connected in parallel with said receiving variable attenuator to limit the attenuation of said receiving variable attenuator to a value which is no greater than a predetermined value.

\* \* \* \* \*